United States Patent
Beckmann et al.

(10) Patent No.: US 7,890,563 B2
(45) Date of Patent: Feb. 15, 2011

(54) MULTI-CHANNEL SAMPLE RATE CONVERSION METHOD

(75) Inventors: Paul E. Beckmann, Sunnyvale, CA (US); Timothy S. Stilson, Mountain View, CA (US)

(73) Assignee: Analog Devices, Inc., Norwood, MA (US)

( * ) Notice: Subject to any disclaimer, the term of this patent is extended or adjusted under 35 U.S.C. 154(b) by 1373 days.

(21) Appl. No.: 11/375,874

(22) Filed: Mar. 14, 2006

(65) Prior Publication Data

US 2006/0212503 A1   Sep. 21, 2006

Related U.S. Application Data

(60) Provisional application No. 60/662,175, filed on Mar. 15, 2005.

(51) Int. Cl.
   *G06F 17/17* (2006.01)

(52) U.S. Cl. .................. 708/313; 708/319

(58) Field of Classification Search .......... 708/308, 708/313, 319
   See application file for complete search history.

(56) References Cited

U.S. PATENT DOCUMENTS

| 4,868,868 | A   | * | 9/1989 | Yazu et al. ............ 704/205 |
| 7,248,189 | B2  | * | 7/2007 | Sinha et al. ........... 341/61 |
| 2003/0161477 | A1 | * | 8/2003 | Wu et al. ............. 381/2 |
| 2003/0161486 | A1 | * | 8/2003 | Wu et al. ............. 381/94.4 |

* cited by examiner

*Primary Examiner*—Chuong D Ngo
(74) *Attorney, Agent, or Firm*—Koppel, Patrick, Heybl & Dawson

(57) ABSTRACT

A sampling-rate conversion method receives N input channels which have been digitized at an input sampling rate, and converts the sampling rate of each input channel to produce N output channels at an output sampling rate. The method comprises computing a common FIR interpolating function which depends upon the input and output sample clocks and the instantaneous output time, and applying the common FIR interpolating function to all N input channels to compute all N output channels.

12 Claims, 4 Drawing Sheets

○ Original sample values x[n]

× Values that can be <u>accurately</u> calculated using a set of fractional interpolation filters. (8 filters shown)

MULTI-CHANNEL SAMPLE RATE CONVERSION METHOD

RELATED APPLICATIONS

This application claims the benefit of provisional patent application No. 60/662,175 to Beckmann et al., filed Mar. 15, 2005.

BACKGROUND OF THE INVENTION

1. Field of the Invention

This invention relates to sampling-rate conversion (SRC), and particularly to methods of performing SRC for multiple input channels.

2. Description of the Related Art

Sampling-rate conversion (SRC) is the process of converting a discrete-time signal x[n] sampled at a rate $FS_{in}$ to another signal y[m] sampled at a rate $FS_{out}$. "Synchronous" SRC occurs when a single master clock in the system generates the input and output sample clocks; asynchronous SRC occurs when there are separate clocks on the input and output.

Audio applications requiring SRC were once restricted to high-end mixing consoles and post-production systems. However, with the advent of streaming audio, networked audio players, and compressed audio, SRC is being incorporated into a variety of consumer products. SRC can be done in either hardware or software. Hardware implementations may be stand-alone IC's, such as the Analog Devices AD1896, or peripherals integrated into audio-specific digital signal processors (DSPs), such as the Analog Devices ADSP-21364. Alternatively, software implementations are attractive when the audio system already contains a DSP with spare resources, or if the SRC occurs between two software modules such as an audio decoder and effects processing.

An illustration of the process is shown in FIG. 1. An input signal x[n] is converted with a digital-to-analog converter (D/A) 10 to a continuous-time signal x(t) at a rate $FS_{in}$, filtered by a filter 12 which implements a function H(S) to produce a continuous-time signal y(t), and then sampled with an analog-to-digital (A/D) converter 14 at a sampling-rate $FS_{out}$ to give the output y[m]. The function H(S) implements a low-pass filter which eliminates any frequency components which cannot be represented at the new sampling rate. The design challenge is to implement a discrete-time simulation of this process both accurately and efficiently.

It has been determined that this design is theoretically equivalent to the implementation of a time-varying discrete-time filter, whose time-varying kernel is $h(n-mT_{in})$ and which is evaluated at a sampling period of $T_{out}$ (where $T_{in}=1/FS_{in}$, and $T_{out}=1/FS_{out}$). In other words, the ideal time-varying filter has a kernel consisting of samples of the ideal continuous-time filter, spaced according to the sampling-rates, and offset according to the instantaneous "phase" of the converter. The major differences between most SRC techniques tend to be in the ways that they implement the time-varying filter and/or how they update the filter coefficients in order to be as efficient as possible.

A good background for the SRC problem is found in Crochiere and Rabiner, *Multirate Digital Signal Processing*, Prentice-Hall, Inc., 1983, pp. 39-42, which describes the "classical" rational-ratio design of implementing the ratio L/M as an upsampling by a factor of L followed by appropriate filtering, followed by a downsampling by a factor of M. This method tends to be useful for small values of L and M; otherwise, the intermediate sampling-rate tends to get unwieldy. It is, however, often used as the starting point for other design derivations.

Several methods are described in T. A. Ramstad, *Digital Methods for Conversion Between Arbitrary Sampling Frequencies*, IEEE Transactions on Acoustics, Speech, and Signal Processing, Vol. ASSP-32, No. 3, June 1984, which employ both finite impulse response (FIR) and infinite impulse response (IIR) filters. A straightforward implementation of the $h(n-mT_{in})$ filter is first presented, where a rational ratio is assumed, and thus the coefficients of the runtime filter are simply a periodic visiting of elements of a precomputed array containing the required samples of h(t). While in essence a synchronous technique, it can be extended to asynchronous usage, at the penalty of needing a very large array to reduce artifacts due to not interpolating the coefficients. Further variations include implementing an integer-ratio upsampler followed by a low-order polynomial interpolator.

A design for h(t) based on the windowed sinc function is presented in Smith and Gosset, *A Flexible Sampling-Rate Conversion Method*, ICASSP-84, Volume II, pp. 19.4.1-19.4.2. New York, IEEE Press (March, 1984). Here, an asynchronous conversion method computes runtime FIR coefficients for the variable filter via linear interpolation from a precomputed table. The method is designed to be used for a wide range of conversion ratios with a single table, which requires that the FIR coefficient generation handle a particularly general case. The Analog Devices AD1896 hardware sample-rate converter implements a similar concept to the Smith-Gosset design, but with higher-order interpolation of the table lookups to keep the table size down.

A paper by Russell and Beckmann, *Efficient Arbitrary Sampling-rate Conversion With Recursive Calculation of Coefficients*, IEEE Transactions on Acoustics, Speech, and Signal Processing, Vol. 50, No. 4, April 2002, presents an innovative IIR-based technique which computes IIR filter coefficients recursively on the fly and can thus be very efficient. However, being an IIR technique, it cannot implement linear phase designs.

A different approach to the basic problem is presented in C. W. Farrow, *A Continuously Variable Digital Delay Element*, Proc. 1988 IEEE In. Symp. Circuits Syst. (Espoo, Finland), pp. 2641-2645, June 1988, and is enhanced in a series a papers, notably Vesma and Saramäki, *Design and Properties of Polynomial-Based Fractional Delay Filters*, ISCAS 2000—IEEE Int. Symp. on Circuits and Systems, pp. I-104-107, May 2000. In this case, the h(t) filtering and the interpolation are transposed, such that instead of implementing an interpolation between a number of oversampled samples (or sub-sample-delay filters), the coefficients of the interpolation itself are filters. In this situation, the design of the interpolators and the filters are combined into a single design, and the time-variation is limited to a single parameter, leaving the filters to be time-invariant. This technique is still being developed, however, and it appears that most of the development has been done with low-order filters. A method for designing the filters in terms of h(t) has been recently shown in J. Vesma, *A Frequency-Domain Approach to Polynomial-Based Interpolation and the Farrow Structure*, IEEE Transaction on Circuits and Systems—II: Analog and Digital Signal Processing, Vol. 47, No. 3, March 2000, such that it is not yet clear how designs based on this method compare to designs following the above tracks, either from an efficiency standpoint or from a distortion performance standpoint.

Almost all existing techniques either do not or cannot separate the variation in the time-varying filter's design from the running of the filter. As such, most methods end up having to replicate large portions of the algorithm (if not the whole algorithm) across channels when converting multi-channel signals (where all the channels are sampled synchronously).

SUMMARY OF THE INVENTION

A method of performing multi-channel SRC is presented, which is particularly efficient at converting multiple audio channels. The method employs an algorithm which combines fractional sample delay filters with cubic polynomial interpolation. Although conceptually similar to existing methods, the manner in which the calculations are partitioned is novel and provides computational efficiency.

The present SRC method receives N input channels which have been digitized at the same input sampling rate, and converts the sampling rate of each input channel to produce N output channels at the same output sampling rate. The method comprises computing a common FIR interpolating function which depends upon the input and output sample clocks and the instantaneous output time, and applying the common FIR interpolating function to all N input channels to compute all N output channels. The present method can be used for both synchronous and asynchronous SRC.

The method presented herein was designed with an emphasis on factoring out as much of the channel-independent processing as possible, in order to minimize the amount of processing that must be replicated on a per-channel basis. Thus, there is a large upfront cost that is shared, but only a small incremental cost for adding additional channels.

Further features and advantages of the invention will be apparent to those skilled in the art from the following detailed description, taken together with the accompanying drawings.

DETAILED DESCRIPTION OF THE INVENTION

Converting between sampling-rates is equivalent to interpolating between sample values in a discrete-time signal. Consider a bandlimited continuous-time signal x(t) that has been sampled at a rate $FS_{in}$ to generate a discrete-time signal $$x[n] = x\left(\frac{n}{F_{in}}\right).$$

Figure 1:
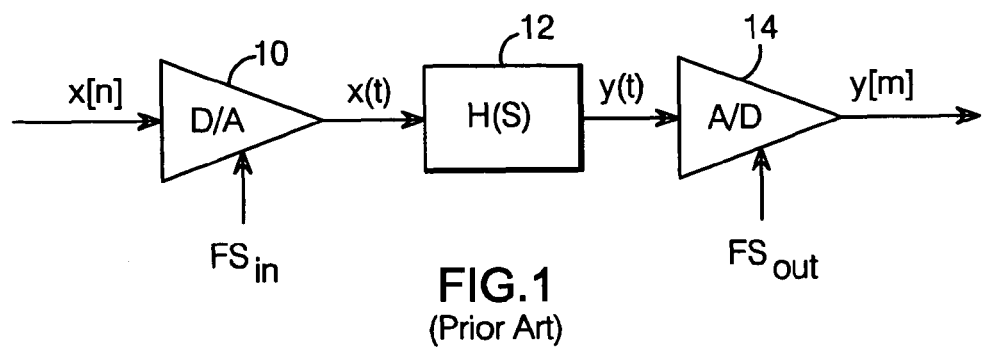
FIG. 1 is a block diagram illustrating the SRC process.
Figure 2:
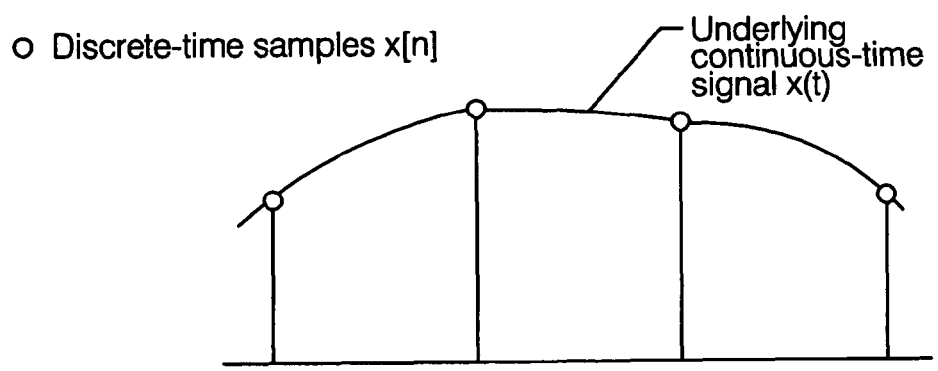
FIG. 2 is a graph which plots original sample values versus time.

This is shown in FIG. 2; the circles represent the input sample values x[n] and the solid line represents x(t). Discrete-time signals are denoted herein with square brackets (e.g., x[n] and y[m]), and continuous-time signals are denoted with parentheses (x(t) and y(t)). Converting to a different output sampling-rate is equivalent to calculating values of the underlying continuous time function x(t) at the output sample times. Let y[m] represent the resampled output signal at rate $FS_{out}$; y[m] is related to x(t) via the equation $$y[m] = x\left(\frac{m}{F_{out}}\right).$$

The SRC method described herein is based on polynomial interpolation. For ease of illustration, cubic interpolation is described; however, the technique applies to other order polynomials in a straightforward fashion. The method comprises computing a common FIR interpolating function which depends upon the input and output sample clocks and the instantaneous output time, and applying the common FIR interpolating function to all N input channels to compute all N output channels.

In the discussion that follows, the derivation of the basic algorithm is described first, followed by the presentation of a final, algebraically-optimized form of the algorithm.

Figure 3:
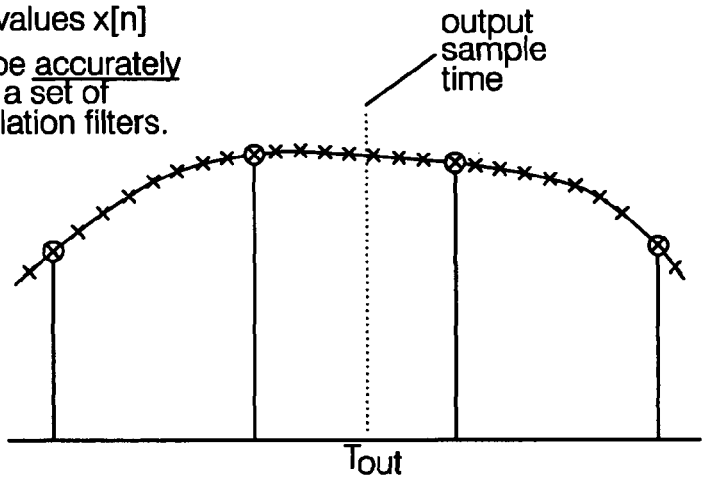
FIG. 3 is a graph which plots original and calculated sample values versus time.
Figure 4:
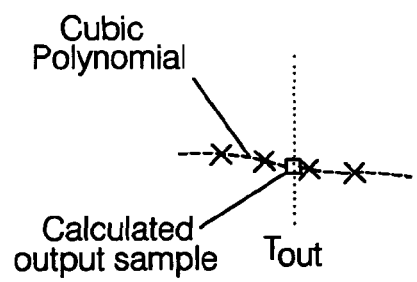
FIG. 4 is a graph illustrating the use of polynomial interpolation around an output sample time $T_{out}$.

The method begins with a precomputed set of M interpolation filters that calculate values spaced every 1/M input samples; the value of M is application dependent. These interpolation filters are FIR (in order to be linear phase) and are conceptually equivalent to fractional sample delay filters. With these M filters, x(t) can be calculated exactly at all of the X's shown in FIG. 3; M=8 in the illustrated example. An output value to be calculated at a particular output sample time is indicated by the vertical dashed line in FIG. 3, and denoted by $T_{out}$. Since $T_{out}$ usually does not fall exactly on an X, its value must be estimated based on neighboring samples. First, the output signal is calculated at the 4 nearest X values (shown in bold) using the precomputed interpolation filters, such that two X values lie to the left and two X values lie to the right of $T_{out}$. Then, a 3rd order polynomial is fitted through these 4 values, and evaluated at $T_{out}$ as shown in FIG. 4.

The overall process for 1 sample value is summarized as:
1. Calculate the four nearest X values: two to the left, and two to the right of the desired output time.
2. Fit a cubic polynomial to these four values.
3. Evaluate this polynomial at the desired output time $T_{out}$.

Note that, while four X values and a cubic polynomial are preferred, the present method could be practiced with more than four X values, as well as with other order polynomials. However, for purposes of explanation, the discussion that follows assumes that four X values are calculated, and a cubic polynomial is fit to the four values.

Next, the proper coefficient sets needed to calculate the X values are determined. In order to simplify the discussion, and without loss of generality, we will assume that the output sampling rate $FS_{out}$ equals 1. Separate $T_{out}$ into an integer and fractional portion: $T_{out}=N+t_{out}$, where N=floor($T_{out}$) and $t_{out}=T_{out}-N$. Based on this decomposition, $0 \leq t_{out} < 1$. The set of interpolating filters to use depends solely on $t_{out}$; N only introduces a whole sample delay and specifies which set of input samples to use in the calculation. Let $h_k[n]$ denote the interpolation filter that calculates the output at time k/M, with k=0,1, ..., M−1. The 4 nearest sample values would be calculated using the filters $h_k[n]$, $h_{k+1}[n]$, $h_{k+2}[n]$, and $h_{k+3}[n]$, where k=floor($t_{out}$*M)−2.

Examining this equation, it is seen that k falls in the range −2≤k≤M−3. Furthermore, once k is calculated, that a total of 4 filters are needed: k, k+1, k+2, and k+3. The total set of filters required is thus: k=−2,−1,0,1, ..., M. This set contains M+3 filters, not just the original M. If desired, this set can be slightly simplified by changing the previous equation to k=floor($t_{out}$*M). The only effect of this change is to introduce an additional latency of 2/M samples through the system. With this change, the set of filters required is k=0,1,...,M+2. Note that the last 3 filters in this set are whole sample delays of the first 3 filters and are related by:

$$h_M[n]=h_0[n-1]$$

$$h_{M+1}[n]=h_1[n-1]$$

$$h_{M+2}[n]=h_2[n-1]$$

When arranged such that k=0,1,...,M+2, the interpolating filters calculate the output at times $$\left\{0, \frac{1}{M}, \frac{2}{M}, \ldots, \frac{M+2}{M}\right\}.$$

Let L denote the length of these filters. These filters extend before and after the desired output time, and are thus non-causal. By introducing some latency into the processing the overall system is made causal. Apply the filter starting at time N and extending for L samples. Then, the nearest four X values, referred to herein as a, b, c, and d, are calculated as:

$$a = \sum_{i=0}^{L-1} h_k[i]x[N+i]$$

$$b = \sum_{i=0}^{L-1} h_{k+1}[i]x[N+i]$$

$$c = \sum_{i=0}^{L-1} h_{k+2}[i]x[N+i]$$

$$d = \sum_{i=0}^{L-1} h_{k+3}[i]x[N+i]$$

Now, further decompose $t_{out}$ into an "integer" and fractional portion, where the integer portion relates to the 1/M sample spacing: $t_{out}=T_M+tt$, where $$T_M = \frac{1}{M} \text{floor}(t_{out}M) = \frac{k}{M}$$

and tt=$t_{out}-T_M$. Note that tt is in the range $$0 \le tt < \frac{1}{M}.$$

Figure 5:
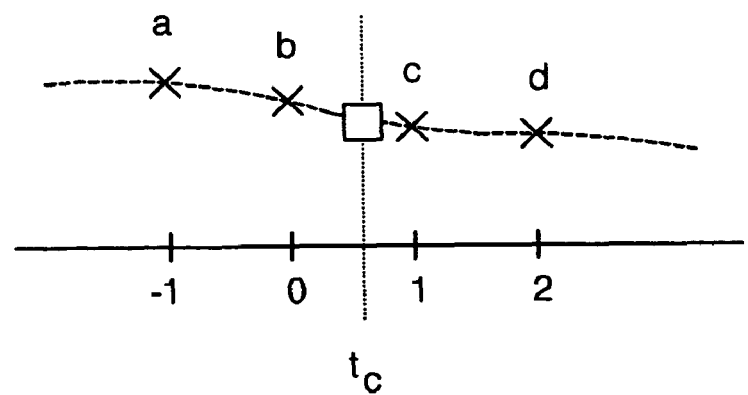
FIG. 5 is a graph which plots the fractional position ($t_c$) between precomputed interpolation values.

Scale tt to obtain the quantity $t_c$ which lies in the range $0 \le t_c < 1$: $t_c = M$ tt. The quantity $t_c$ represents the fractional position between the precomputed interpolation values (i.e., the X's in FIG. 4), as shown in FIG. 5.

The entire cubic interpolation process can be condensed into a single set of linear equations. The output y[m] can be computed from a linear weighted sum of the values a, b, c, and d in which the weighting coefficients depend solely on $t_c$: y[m]=$w_a$a+$w_b$b+$w_c$c+$w_d$d, where:

$$w_a = -\frac{1}{6}t_c^3 + \frac{1}{2}t_c^2 - \frac{1}{3}t_c$$

$$w_b = \frac{1}{2}t_c^3 + -t_c^2 - \frac{1}{2}t_c + 1$$

$$w_c = -\frac{1}{2}t_c^3 + \frac{1}{2}t_c^2 + t_c$$

$$w_d = \frac{1}{6}t_c^3 - \frac{1}{6}t_c.$$

Figure 6:
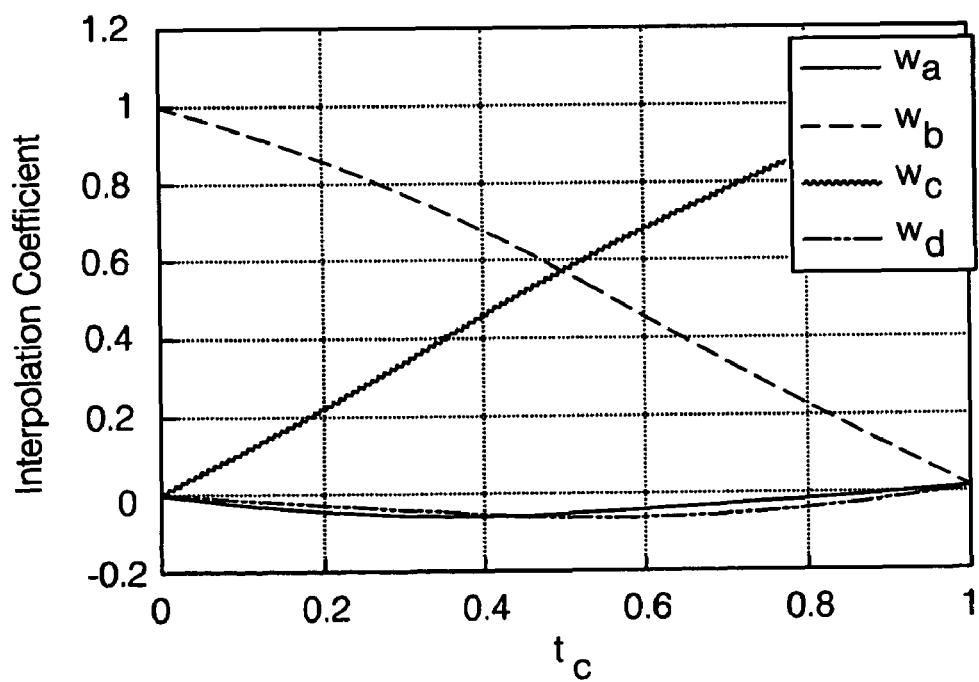
FIG. 6 is a graph of the weighting functions associated with the polynomial interpolation of the present method.

These weighting coefficients are plotted in FIG. 6.

The final algorithm implements an algebraic optimization of the one just presented. Instead of computing a weighted sum of filter outputs, the same weighting can be applied to the filter coefficients themselves to derive a single time-varying filter. Substituting in the definitions for a, b, c, and d into y[m] above yields:

$$y[m] = w_a\left(\sum_{i=0}^{L-1} h_k[i] \times [N+i]\right) + w_b\left(\sum_{i=0}^{L-1} h_{k+1}[i] \times [N+i]\right) +$$
$$w_c\left(\sum_{i=0}^{L-1} h_{k+2}[i] \times [N+i]\right) + w_d\left(\sum_{i=0}^{L-1} h_{k+3}[i] \times [N+i]\right)$$
$$= \sum_{i=0}^{L-1} (w_a h_k[i] + w_b h_{k+1}[i] + w_c h_{k+2}[i] + w_d h_{k+3}[i]) \times [N+i]$$
$$= \sum_{i=0}^{L-1} h_{net}[i] \times [N+i]$$

where $$h_{net}[i] = w_a h_k[i] + w_b h_{k+1}[i] + w_c h_{k+2}[i] + w_d h_{k+3}[i].$$

This rearrangement of computation does not yield a benefit when a single channel is processed, but allows multiple synchronous channels to be computed efficiently. When multiple channels, all sampled at the same sample times, are involved, the filter $h_{net}[i]$ will be the same for each channel. Thus, $h_{net}[i]$ can be computed once and then applied to each channel in turn. The incremental computation required to process subsequent channels is equivalent to that required by a simple FIR filter.

To summarize, for each output time sample, perform the following steps once:

1. Keep track of the fractional time offset $t_c$ using the input and output sampling-rates.
2. Calculate the weighting coefficients $w_a$, $w_b$, $w_c$, and $w_d$ per the equations shown above.
3. Calculate $h_{net}[i]$ as a weighted sum of FIR filters.
4. Apply $h_{net}[i]$ separately to each input channel to calculate one sample of each output channel.

Figure 7:
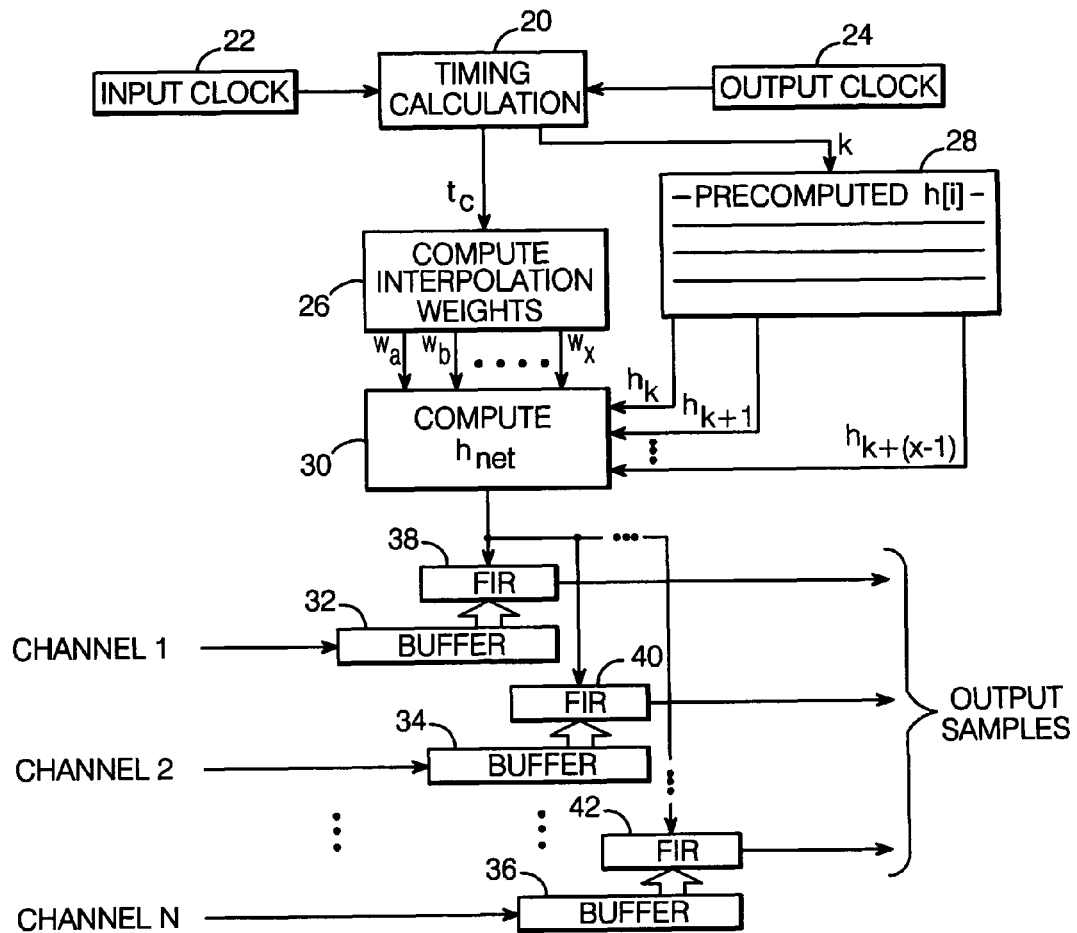
FIG. 7 is a block diagram illustrating the concept of the present multi-channel SRC method.

A block diagram which illustrates the primary concepts of the present multi-channel SRC method, i.e., that of computing a single set of FIR coefficients by interpolating between filters chosen from a precomputed set, and then applying that FIR filter to all the inputs, is shown in FIG. 7. A timing calculation block 20 performs the calculations needed to produce $t_c$, as described previously, but which can also be expressed as: $t_c$=M*($T_{out}$-floor($T_{out}$))-floor(M*($T_{out}$-floor($T_{out}$))), and k, which can be expressed as: k=floor(M*($t_{out}$-floor($T_{out}$)). Block 20 takes inputs from both the input clock (22) and output clock (24), as $T_{out}$ is a function of the two clock values.

The quantity $t_c$ is provided to a block 26, which performs the computations required to produce weighting coefficients $w_a, w_b, \ldots, w_x$. The k value is provided to a block 28, which contains an array of precomputed coefficients h[i]; each row of the array contains the coefficients for one of the M+x filters.

Block 28 is arranged to look up the k'th set of coefficients, the (k+1)'th set, and so forth. These coefficient sets, along with the weighting coefficients from block 26, are passed to an $h_{net}$ computation block 30, which calculates $h_{net}$ per the $h_{net}[i]$ equation shown above.

Once calculated, $h_{net}[i]$ can be applied to each input channel in turn. Since there is assumed to be no fixed relation between the input and output sample times, a buffer must be used to absorb drift between the clocks (and other artifacts of having independent clocks). Thus, each input channel is provided to a respective buffer 32, 34, 36, and the timing calculator determines on the fly where to read from the buffer to extract the output samples. The read point will almost always end up between input samples, and so some interpolation is required. The quality of the interpolation determines the quality of the SRC. The FIR filters, implementing $h_{net}$, provide this interpolation.

The FIR filters (38, 40, 42) read from locations in the buffers (the locations controlled by the timing calculator based primarily on floor($T_{out}$), but also on implementation details like the sizes of the buffers, buffer circularity, etc).

The design of the FIR filters employed herein is accomplished using standard techniques which are well-known to those familiar with the field of digital filter design. See, e.g., Parks, T. W., and Burrus, C. S., "Digital Filter Design", John Wiley and Sons, New York, N.Y., 1987, pp. 33-110.

While particular embodiments of the invention have been shown and described, numerous variations and alternate embodiments will occur to those skilled in the art. Accordingly, it is intended that the invention be limited only in terms of the appended claims.

We claim:

1. A method of converting the sampling rate of multiple input channels, comprising:
   digitizing N input channels at a first sampling rate; and
   converting the sampling rate of each of said N input channels to produce N output channels at a second output sampling rate; said sampling rate conversion comprising:
      computing with one or more microprocessors a common FIR interpolating function which depends upon the input and output sample clocks and the instantaneous output time; and
      applying said common FIR interpolating function to all N input channels to compute all N output channels;
   wherein said computing of a common FIR interpolating function comprises:
   decomposing instantaneous output time ($T_{out}$) into integer and fractional portions where $T_{out}=N+t_{out}$, where $N=\text{floor}(T_{out})$ and $t_{out}=T_{out}-N$;
   providing a set of M precomputed FIR filter coefficient sets, each of said filter sets denoted as $h_k[n]$ and arranged to calculate a fractionally-delayed output at time k/M, with $k=0, 1, \ldots, M-1$;
   choosing the x filter coefficient sets nearest $T_{out}$: $h_k[n]$, $h_{k+1}[n], h_{k+2}[n], \ldots, h_{k+(x-1)}[n]$ where $k=\text{floor}(t_{out}*M)-2$;
   decomposing $t_{out}$ into integer and fractional portions where $t_{out}=T_M+tt$, $$T_M = \frac{1}{M} \text{floor}(t_{out}M) = \frac{k}{M},$$

and $tt=t_{out}-T_M$;
   scaling tt to obtain the quantity $t_c$ which lies in the range $0 \le t_c < 1$, where $t_c = M\ tt$; and
   using polynomial interpolation to compute the desired interpolating function $h_{net}[i]$ from a linear weighted sum of the filter coefficient sets $h_k[n], h_{k+1}[n], h_{k+2}[n], \ldots, h_{k+(x-1)}[n]$ in which the weighting coefficients depend solely on $t_c$:

$$h_{net}[i]=w_a(t_c)h_k[i]+w_b(t_c)h_{k+1}[i]+w_c(t_c)h_{k+2}[i]+\ldots +w_x(t_c)h_{k+(x-1)}[i],$$

$h_{net}[i]$ being said common FIR interpolating function.

2. The method of claim 1, wherein said sampling rate conversion is asynchronous.

3. The method of claim 1, wherein said sampling rate conversion is synchronous.

4. The method of claim 1, wherein applying said FIR interpolating function to all N input channels to compute all N output channels comprises:
   calculating $h_{net}[i]$; and
   applying $h_{net}[i]$ separately to each input channel to calculate one sample of each output channel.

5. The method of claim 1, wherein x=4 and said polynomial interpolation employs a cubic polynomial.

6. The method of claim 5, wherein x=4 and said polynomial interpolation employs a cubic polynomial, such that $h_{net}[i] = w_a(t_c)h_k[i]w_b(t_c)h_{k+1}[i]+w_c(t_c)h_{k+2}[i]+w_d(t_c)h_{k+3}[i]$, where:

$$w_a = -\frac{1}{6}t_c^3 + \frac{1}{2}t_c^2 - \frac{1}{3}t_c$$

$$w_b = \frac{1}{2}t_c^3 + -t_c^2 - \frac{1}{2}t_c + 1$$

$$w_c = -\frac{1}{2}t_c^3 + \frac{1}{2}t_c^2 + t_c$$

$$w_d = \frac{1}{6}t_c^3 - \frac{1}{6}t_c.$$

7. The method of claim 1, further comprising introducing a latency of 2/M samples such that $k=\text{floor}(t_{out}*M)$.

8. The method of claim 1, wherein said N input channels are respective audio channels.

9. The method of claim 1, wherein said microprocessors are digital signal processors.

10. A method of converting the sampling rate of multiple input channels, comprising:
   digitizing N input channels at a first sampling rate; and
   converting the sampling rate of each of said N input channels to produce N output channels at a second output sampling rate; said sampling rate conversion comprising:
      computing with one or more microprocessors a common FIR interpolating function which depends upon the input and output sample clocks and the instantaneous output time; and
      applying said common FIR interpolating function to all N input channels to compute all N output channels,
   wherein said computing of a common FIR interpolating function comprises:

decomposing instantaneous output time ($T_{out}$) into integer and fractional portions where $T_{out}=N+t_{out}$, where $N=\text{floor}(T_{out})$ and $t_{out}=T_{out}-N$;

providing a set of M precomputed FIR filter coefficient sets, each of said filter sets denoted as $h_k[n]$ and arranged to calculate a fractionally-delayed output at time k/M, with k=0,1, ..., M−1;

choosing the four filter coefficient sets nearest $T_{out}$: $h_k[n], h_{k+1}[n], h_{k+2}[n], \ldots, h_{k+3}[n]$ where k=floor($t_{out}*M$);

decomposing $t_{out}$ into integer and fractional portions where $t_{out}=T_M+tt$, $$T_M = \frac{1}{M}\text{floor}(t_{out}M) = \frac{k}{M},$$

and $tt=t_{out}-T_M$;

scaling tt to obtain the quantity $t_c$ which lies in the range $0 \leq t_c < 1$, where $t_c = M\, tt$;

using polynomial interpolation to compute the desired interpolating function $h_{net}[i]$ from a linear weighted sum of the filter coefficient sets $h_k[n], h_{k+1}[n], h_{k+2}[n], \ldots, h_{k+3}[n]$ in which the weighting coefficients depend solely on $t_c$: $h_{net}[i]=w_a(t_c)h_k[i]+w_b(t_c)h_{k+1}[i]+w_c(t_c)h_{k+2}[i]+w_d(t_c)h_{k+3}[i]$, where:

$$w_a = -\frac{1}{6}t_c^3 + \frac{1}{2}t_c^2 - \frac{1}{3}t_c$$

$$w_b = \frac{1}{2}t_c^3 + -t_c^2 - \frac{1}{2}t_c + 1$$

$$w_c = -\frac{1}{2}t_c^3 + \frac{1}{2}t_c^2 + t_c$$

$$w_d = \frac{1}{6}t_c^3 - \frac{1}{6}t_c;$$

$h_{net}[i]$ being said common FIR interpolating function; and applying $h_{net}[i]$ separately to each input channel to calculate one sample of each output channel.

11. The method of claim 10, wherein said N input channels are respective audio channels.

12. The method of claim 10, wherein said microprocessors are digital signal processors.

* * * * *

UNITED STATES PATENT AND TRADEMARK OFFICE
CERTIFICATE OF CORRECTION

| | | |
|---|---|---|
| PATENT NO. | : 7,890,563 B2 | Page 1 of 1 |
| APPLICATION NO. | : 11/375874 | |
| DATED | : February 15, 2011 | |
| INVENTOR(S) | : Beckmann et al. | |

It is certified that error appears in the above-identified patent and that said Letters Patent is hereby corrected as shown below:

In the claims, column 8, line 33, Claim 6, in the first equation in this claim, please add a --+-- between the "[i]" and "w"

Signed and Sealed this
Twenty-eighth Day of June, 2011

David J. Kappos
*Director of the United States Patent and Trademark Office*